United States Patent
Chen et al.

(10) Patent No.: US 11,288,424 B2
(45) Date of Patent: Mar. 29, 2022

(54) ADAPTIVE TIME SCALING FOR ACCELERATING EXPLICIT FINITE ELEMENT ANALYSIS

(71) Applicants: GM GLOBAL TECHNOLOGY OPERATIONS LLC, Detroit, MI (US); UT-Battelle, LLC, Oak Ridge, TN (US)

(72) Inventors: Jian Chen, Oak Ridge, TN (US); Hui Huang, Oak Ridge, TN (US); Zhili Feng, Oak Ridge, TN (US); Blair Carlson, Ann Arbor, MI (US); Hui-Ping Wang, Warren, MI (US); Wayne Cai, Troy, MI (US)

(73) Assignees: GM Global Technology Operations LLC, Detroit, MI (US); UT-Battelle, LLC, Oak Ridge, TN (US)

( * ) Notice: Subject to any disclaimer, the term of this patent is extended or adjusted under 35 U.S.C. 154(b) by 294 days.

(21) Appl. No.: 16/451,513

(22) Filed: Jun. 25, 2019

(65) Prior Publication Data
US 2020/0134113 A1 Apr. 30, 2020

Related U.S. Application Data

(60) Provisional application No. 62/749,719, filed on Oct. 24, 2018.

(51) Int. Cl.
*G06F 30/23* (2020.01)
*G06F 17/11* (2006.01)
(Continued)

(52) U.S. Cl.
CPC .............. *G06F 30/23* (2020.01); *G06F 17/11* (2013.01); *G06T 15/005* (2013.01); *G06T 19/00* (2013.01)

(58) Field of Classification Search
CPC ........ G06F 30/23; G06F 17/11; G06T 15/005; G06T 19/00
(Continued)

(56) References Cited

U.S. PATENT DOCUMENTS 8,855,976 B2 * 10/2014 Hallquist ................ G06F 30/23
703/2
9,418,185 B2 * 8/2016 Madhavan .............. G06F 30/23

OTHER PUBLICATIONS

Hammelmüller, Franz et al. Increasing Numerical Efficiency in Coupled Eulerian-Lagrangian Metal Forming Simulations, XIII International Conference on Computational Plasticity. Fundamentals and Applications (Year: 2015).*

(Continued)

*Primary Examiner* — Kamini S Shah
*Assistant Examiner* — John E Johansen
(74) *Attorney, Agent, or Firm* — Quinn IP Law

(57) ABSTRACT

A method for accelerating an explicit finite element analysis (FEA) simulation of a modeled system or process includes performing an initial iteration of the FEA simulation according to a baseline time interval via an FEA computing network, and calculating a criteria ratio of a predetermined set of scaling criteria for the modeled system or process. The method includes determining a time-scaling factor using the criteria ratio via the FEA computing network as a function of the criteria ratio, and then applying the time-scaling factor to the baseline time interval to generate a scaled time interval. The scaled time interval accelerates simulation time of the FEA simulation. The method includes performing a subsequent iteration of the explicit FEA simulation at the scaled time interval using the FEA computing network. The process continues for subsequent iterations, with the time-scaling factor adapting with each iteration.

19 Claims, 2 Drawing Sheets

(51) Int. Cl.
*G06T 19/00* (2011.01)
*G06T 15/00* (2011.01)

(58) Field of Classification Search
USPC .......................................... 703/22
See application file for complete search history.

(56) References Cited

OTHER PUBLICATIONS

Abaqus, F. E. A. "Abaqus Analysis User's Manual", Dassault Systemes Simulia Corporation. Providence, Rhode Island, USA, Version 6.6, https://classes.engineering.wustl.edu/2009/spring/mase5513/abaqus/docs/v6.6/books/usb/default.htm?startat=undefined (Year: 2009).*

Liu, G.R. et al. "A novel alpha finite element method (αFEM) for exact solution to mechanics problems using triangular and tetrahedral elements", Comput. Methods Appl. Meeh. Engrg. 197 pp. 3883-3897 (Year: 2008).*

TNO Diana BV, Diana—Finite Element Analysis User's Manual release 9.4.3: Analysis Procedures, Delftechpark 19a, 2628 XJ Delft, The Netherlands, https://dianafea.com/manuals/d943/Analys/Analys.html (Year: 2010).*

* cited by examiner

ADAPTIVE TIME SCALING FOR ACCELERATING EXPLICIT FINITE ELEMENT ANALYSIS

CROSS-REFERENCE TO RELATED APPLICATIONS

This application claims the benefit of U.S. Provisional Patent Application No. 62/749,719, filed on Oct. 24, 2018, and entitled "ADAPTIVE TIME SCALING METHOD TO ACCELERATE FINITE ELEMENT NUMERICAL ANALYSIS OF TRANSIENT THERMAL STRESS PROBLEMS" filed on Oct. 24, 2018, which is hereby incorporated by reference in its entirety.

STATEMENT REGARDING FEDERALLY SPONSORED RESEARCH

This invention was made with U.S. Government support under an Agreement/Project DE-AC05-00OR22725 awarded by the Department of Energy. The Government has certain rights in the invention.

BACKGROUND

The present disclosure pertains to improvements in Finite Element Analysis (FEA) techniques. In particular, a method and associated computer network are disclosed herein that together are intended to improve scaling techniques, equivalently treated herein as time-scaling and mass-scaling. The present disclosure is intended to be an improvement to time-scaling approaches used in FEA simulations and analysis of non-linear structural systems and/or transient thermal problems. In general, FEA is a numerical problem-solving methodology commonly employed across range of engineering disciplines, e.g., to predict the behavior of complex thermo-mechanical systems, to perform pre-construction structural analysis, for incremental analysis of fluid flow or heat transfer problems, etc.

FEA methods help estimate real-world system responses to a particular set of input conditions or stimuli by solving complex mathematical models of an analyzed system or process. The results of FEA analysis may be graphically depicted using three-dimensional color renderings to show a particular system response, for instance distributions of stresses or strains, temperature gradients, distortions, pressure distributions, etc. The simulated responses are ultimately used to optimize the design and construction of the physical system and/or process for subsequent testing and validation.

Non-linear FEA techniques may be of an explicit or an implicit variety. The decision to use an explicit or an implicit FEA method directly affects the speed and potential computational parallelization of the calculations. Generally, explicit FEA methods utilize a lumped mass matrix that decouples the underlying model equations. Explicit FEA methods are often used to estimate the state of a given system/process at multiple future time points. In contrast, implicit FEA methods generally solve an equation inclusive of both current and future states of the system or process. This requires additional computation, and therefore implicit FEA methods are most often used when the analyzed problem is static or quasi-static and the use of alternative analysis methods are impractical.

Relative to implicit FEA techniques, explicit FEA is more easily scaled with increased processing power, and thus tends to be easier and faster to implement using modern parallel-core computing architectures. However, acceptable levels of simulation accuracy using current explicit FEA techniques generally requires the use of small increments of solution time, and therefore explicit FEA techniques are not well suited to rapidly analyzing certain system or process responses, such as but not limited to analysis of non-linear and/or transient thermal-stress evolutions, e.g., in welding processes and the additive manufacturing of metals and metal structures, particularly for manufacturing processes with long durations, such as several seconds or more.

SUMMARY

An adaptive time scaling method is disclosed herein for accelerating explicit nonlinear FEA-based analyses and simulations of the type generally described above. As used herein, the term "nonlinear FEA" may encompass nonlinear structural dynamics analysis and transient thermal analysis, among others. If the noted analyses are coupled, the problem becomes one of coupled nonlinear thermal-structural analysis, an example of which being a laser welding process simulation as described herein.

That is, laser welding is a non-limiting exemplary process having properties lending themselves to employing explicit FEA methods. As will be appreciated by those of ordinary skill in the art, laser-welded metal components exhibit complex, non-linear and transient thermal and mechanical responses during and subsequent to heating.

The present method addresses the particular problem of unacceptably long analysis and simulation times by adaptively determining and applying a time-scaling factor in real-time based on estimated error. Error caused by a given time-scaling factor may change considerably at different stages of the solution process, and therefore the use of predetermined constant time-scaling factors may not be optimal, as will be appreciated by those of ordinary skill in the art.

According to a disclosed embodiment, the method may include performing an initial iteration of the explicit FEA simulation according to a baseline time interval via an FEA computing network, and then calculating a criteria ratio of a predetermined set of scaling criteria for the modeled system or process via the FEA computing network. The method further includes determining a time-scaling factor using the criteria ratio via the FEA computing network as a function of the criteria ratio, and applying the time-scaling factor to the baseline time interval to thereby generate a scaled time interval. The scaled time interval accelerates simulation time of the FEA simulation, i.e., accelerates the explicit FEA simulation to reduce a required amount of FEA processing time. Additionally, the method includes performing a subsequent iteration of the explicit FEA simulation at the scaled time interval using the FEA computing network. Each subsequent iteration therefore looks forward in time a potentially different interval of time based on the criteria ratio calculations, e.g., moving farther forward in time when the simulation results remain relatively unchanged or static.

For each subsequent iteration of the FEA simulation logic, whether such logic models the total modeled system/process or just a designated portion or sub-model thereof, the method includes calculating one or more criteria ratios of a predetermined set of scaling criteria for the modeled system or process via the computing network, and also determining the time-scaling factor using the criteria ratio(s). The time-scaling factor may be inversely related to the calculated criteria ratio(s). For illustrated simplicity, the singular term "ratio" will be used hereinafter without limiting embodiments to a single criteria ratio, i.e., "ratio" as used herein means "at least one" or "one or more" unless otherwise specified.

The time-scaling factor (f) is generally a function of the criteria ratio ($r_x$). A non-limiting exemplary relationship between the time-scaling factor (f) and the criteria ratio ($r_x$) may be expressed as follows:

$$f \propto \frac{k}{r_x^n}$$

where k and n are application-specific/calibrated constants.

Calculating the criteria ratio in some embodiments is conducted for a sub-model of a total model of the modeled system or process.

In a possible embodiment, the criteria ratio may be determined as a function of an energy ratio, a displacement ratio, and/or a force ratio. For instance, the energy ratio may be or may include a ratio of incremental kinetic energy to incremental total energy term in the modeled system or process. Or, the force ratio may be or include ratio of a norm of incremental forces to a norm of incremental maximum forces in the modeled system or process.

The method may include comparing the criteria ratio to a threshold ratio, and then adjusting the time-scaling factor upward or downward by a predetermined amount when the criteria ratio is less than or greater than the threshold ratio, respectively. The time-scaling factor may be adjusted in proportion to an amount by which the criteria ratio exceeds or is exceeded by the threshold ratio.

The modeled system or process may be a laser welding system or process in an exemplary embodiment.

According to another aspect of the disclosure, a computer-readable medium may include instructions, the execution of which by one or more cores or processors of an FEA computing network causes the FEA computing network, subsequent to an initial iteration of the FEA computing logic using a baseline time interval, to calculate a criteria ratio of a predetermined set of scaling criteria for the modeled system or process via the FEA computing network. Such execution also causes the core(s) to determine a time-scaling factor using the criteria ratio, via the FEA computing network, with the time-scaling factor being a function of the criteria ratio, and to apply the time-scaling factor to the baseline time interval, e.g., to multiply, to thereby generate a scaled time interval. The scaled time interval accelerates the explicit FEA simulation to reduce a required amount of FEA processing time. The core(s) also perform a subsequent iteration of the explicit FEA simulation at the scaled time interval using the FEA computing network.

The above-noted features and other features and advantages of the present disclosure are readily apparent from the following detailed description of the best modes for carrying out the disclosure when taken in connection with the accompanying drawings.

Figure 1:
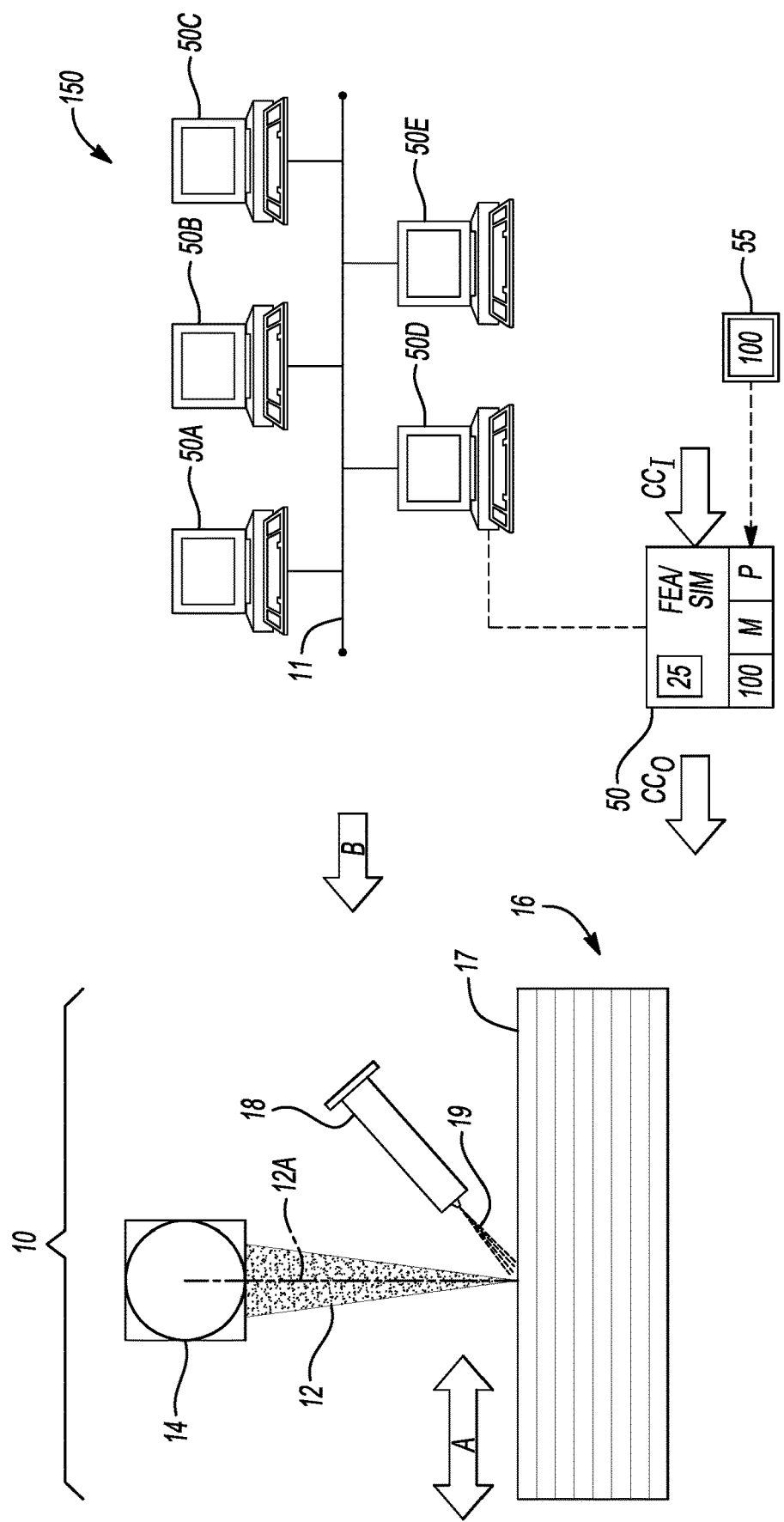
FIG. 1 is a schematic perspective view illustration of an example laser welding process and explicit finite element analysis (FEA)-based computing network configured to perform the present time scaling method.

The present disclosure is susceptible to various modifications and alternative forms, and some representative embodiments have been shown by way of example in the drawings and will be described in detail herein. Inventive aspects of this disclosure are not limited to the particular forms disclosed. Rather, the disclosure is to cover all modifications, equivalents, combinations, sub-combinations, and alternatives falling within the spirit and scope of the disclosure as defined by the appended claims.

DETAILED DESCRIPTION

Referring to the drawings, wherein like reference numbers refer to the same or similar components throughout the several views, a system 10 is depicted in FIG. 1 whose response to a given set of input conditions (arrow $CC_I$) is extensively simulated via a finite element analysis (FEA) computing network 150 prior to production of the system 10. While described herein as the system 10, those of ordinary skill in the art will appreciate that the system 10 is actively performing a process, in this instance a laser welding process, and therefore the system 10 encompasses a system or a process interchangeably.

The FEA computing network 150 is configured to simulate the performance of the system 10 using Finite Element Analysis (FEA) techniques as generally described above, as indicated in FIG. 1 by the label "FEA/SIM". For instance, the FEA computing network 150 may be programmed to execute FEA software depicted in FIG. 1 as FEA simulation logic 25. As will be appreciated, commercially available FEA simulation logic 25 subdivides a real structural item, e.g., a length of metal pipe, into thousands to hundreds of thousands of discrete pieces referred to as "finite elements". Mathematical equations provide a model that, once solved for each of the finite elements, helps estimate behavior of each finite element and the total system or process.

Figure 2:
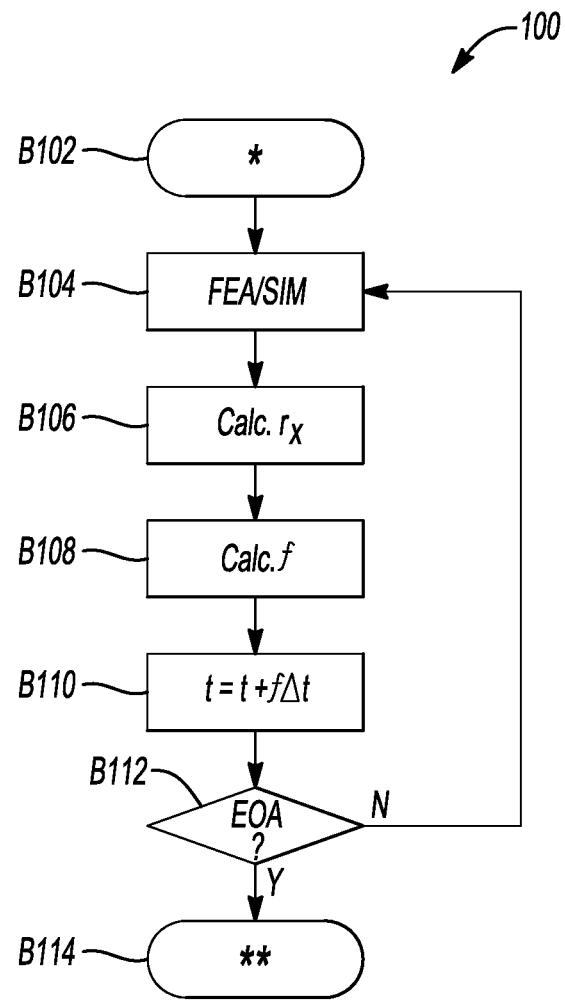
FIG. 2 is a flow chart depicting an example embodiment of the present time scaling method for use with an explicit FEA simulation process.

Temporal performance of such computations using the FEA computing network 150 is enhanced by the present teachings using an adaptive time scaling method 100, an example of which is depicted in FIG. 2 and described below. Thus, the disclosed method 100 as described herein is intended as a specific improvement to the computer-based functionality of the FEA computing network 150. More specifically, the method 100 provides a technological solution to the problem of excessively long processing times using FEA methodologies utilizing conventional time scaling techniques. In this manner, the method 100 helps expedite performance and completion of an explicit FEA simulation with minimal sacrifice to the overall simulation accuracy.

The system 10 of FIG. 1 is depicted as an example laser welding system, which is generally representative of the type of system or process lending itself to explicit FEA-based computer simulation and analysis. That is, the system 10 may exhibit a transient non-linear response to a given set of input criteria. In the context of laser welding typically, such input criteria may include process parameters such as laser power, travel speed, and incident angle, workpiece definitions such as geometry and other properties, boundary/fixture conditions, and initial conditions, e.g., initial process conditions. One or more inputs may vary in real-time. Example outputs or system responses include temperatures, displacements, stresses, strains, etc. Accordingly, operation of the example system 10 may be simulated using available FEA techniques, with the present method 100 used in conjunction with such techniques to adapt a time-scaling factor in real-time as set forth below, and to thereby expedite the time required for completion of the FEA-based simulation.

The exemplary laser welding process of FIG. 1 is a type of high-power metal joining process involving use of a high-energy laser beam 12 emitted by a beam source 14, with the laser beam 12 having a beam axis 12A. Example embodiments of the beam source 14 include but are not limited to diode lasers, $CO_2$ lasers, and solid-state lasers such as Nd: YAG or fiber lasers. The laser beam 12 may act in the presence of an application-suitable shielding gas 19, e.g., helium, argon, or nitrogen. A shielding gas source 18 may be positioned with respect to the beam source 14 and configured to direct the shielding gas 19 toward the laser beam 12, such as at an interface between the laser beam 12 and a surface 17 of a workpiece 16, with the latter constructed of, e.g., carbon steel (mild steel), stainless steel, aluminum, titanium, etc.

The high energy density of the laser beam 12 acting as a heat source in the illustrated laser welding process falls incident upon one or more faying interfaces of the workpiece 16. The intense heat from the laser beam 12 melts the workpiece 16 and/or optional filter wires (not shown). The laser beam 12, the workpiece 16, or both may be moved relative to each other as indicated by arrow A to cause thereby molten portions of the workpiece 16 to flow in a desired direction. The molten material ultimately cools and solidifies to form a weld joint on the workpiece 16.

In a non-limiting exemplary automotive context, for instance, laser welding processes are often used to fabricate vehicle body components such as door panels, deck lids, hoods, load-bearing structural members, supporting cross members, etc. Laser welding of metal workpieces may be used in other industries, such as but not limited to maritime, railway, and aviation industries, building, roadway, and bridge construction, etc. Regardless of the end use of laser-welded components, however, prototype construction and testing remain highly time- and cost-intensive, and therefore explicit FEA techniques are applied to simulate the performance of the system 10 before such construction commences.

Once the behavior of the system 10 is properly modeled using applicable mathematical equations, FEA analysis is executed using the processing power of the representative FEA computing network 150, with such mathematical models possibly being run for various inputs or loads (arrow $CC_I$) to determine different outputs (arrow $CC_O$) as a simulated or estimated system response, as will be appreciated by those of ordinary skill in the art, such as but not limited to mechanical stress, fatigue, displacement due to vibration or other factors, heat transfer, etc.

In the representative system 10 of FIG. 1, the relevant properties are mathematically modeled and solved for a given set of the inputs (arrow CC') using multiple parallel computing nodes of the FEA computing network 150, e.g., nodes 50A, 50B, 50C, 50D, and 50E. Shown as representative computer devices for illustrative simplicity and clarity, each node 50A-50E may be embodied as or include one or several cores, for instance one or more individual processors (P). The number of computing nodes may vary with the application, and therefore the depicted number of nodes 50A-50E is merely representative.

The various nodes 50A-50E communicate with each other over a suitable network connection 11, e.g., a local area network or a wide area network having an application-suitable communications bandwidth, such that the collective computational power of nodes 50A, 50B, 50C, 50D, and 50E is available for FEA calculations when performing an explicit FEA simulation using the FEA simulation logic 25. Once performance of the system 10 has been simulated, the results may be used to develop and construct a physical test embodiment of the system 10, as indicated schematically by the flow of arrow B in FIG. 1.

A computer device 50 is representative of a hardware implementation of each respective one of the nodes 50A, 50B, 50C, 50D, and 50E, and includes the FEA simulation logic 25, instructions embodying the method 100, one or more cores or processors (P), and sufficient memory (M) in the form of read only memory, random access memory, electrically-programmable read only memory, etc. Each node 50A-50E may also include a high-speed clock, analog-to-digital and digital-to-analog circuitry, input/output circuitry and devices, and appropriate signal conditioning and buffering circuitry.

Instructions embodying the present method 100 may be written as one or more user subroutines or user programs that can be selectively executed by the FEA simulation logic 25. That is, rather than modifying the programming code of the FEA simulation logic 25, i.e., an application-suitable commercially-available FEA software suite, the method 100 may exist as an executable subroutine that the FEA simulation logic 25 may selectively execute. Optionally, the instructions embodying the method 100 may be stored on a computer-readable medium 55 such as a removable disc or thumb drive. A user of the computer network 150, assuming the software program embodying the FEA simulation logic 25 is adapted to work with this option, may selectively insert the computer-readable medium 55 into one of the computer devices 50 and selectively execute the method 100 within the algorithm of the FEA simulation logic 25.

For instance, the method 100 may be a subroutine that temporarily allows the FEA simulation logic 25 to employ adaptive time scaling according to the method 100 in lieu of using a resident fixed time-scaling factor. An override event, e.g., a particular keystroke response to a displayed user prompt message, may be detected via the FEA computing network 150, with such an event signaling a desire to override or bypass the resident fixed time-scaling factor in favor of the adaptive time-scaling process of method 100. Execution of instructions embodying the method 100 by a processor (P) of the computer network 150 of FIG. 1 ultimately causes the FEA computing network 150 to execute method 100 and thereby accelerate the FEA simulation time.

A general explicit FEA simulation may be summarized as follows. A time increment is typically estimated upon commencing the FEA analysis, with estimation occurring according to a baseline time increment or several such time increments, e.g., every 0.01 s. The time increment may be based on the following equation:

$$\Delta t = \frac{L^e}{\sqrt{\frac{E}{\rho}}}$$

where $L^e$ can be either the characteristic finite element length or the minimum element size, E is the elastic modulus, and $\rho$ is the density. Once the time increment is initially determined, FEA analysis is carried out to reach the next increment, i.e., t+Δt. A straightforward technique to accelerate a rate-independent quasi-static analysis is to apply a constant time-scaling factor f, as disclosed above, so that the analysis of the next time increment occurs at t=t+f Δt Another such technique is to apply a mass scaling factor on the mass or density of each finite element. The effect of mass scaling is mathematically equivalent to that of time scaling, and therefore the term "time-scaling" is used interchangeably with mass scaling. Such fixed/constant time scaling techniques remain less than optimal when they are used with highly complex mathematical models, as such techniques often lead to undesirably long computational times. The present method 100 is therefore intended to address this problem.

Referring to FIG. 2, the method 100 may be implemented as part of an overall FEA process using the above-noted FEA simulation logic 25 shown schematically in FIG. 1. When updating system or process states at t=t+Δt, for instance, the present method 100 uses the states at t=t+f Δt, with the time-scaling factor f≫1. Instead of using a fixed/constant time-scaling factor, however, the time-scaling factor f is calculated using the control criteria ratio $r_x$ described below. In some embodiments, a portion or sub-model of a total system model used by the FEA simulation logic 25 may be used to determine the criteria ratio $r_x$, e.g., $1/100^{th}$ or $1/10^{th}$ of the total system model, with the time-scaling factor thereafter used when solving the total system model. Such an approach may help expedite simulation analysis time and enhance computational efficiency.

An example embodiment of the method 100 commences at block B102 ("*") where the FEA computing network 150 shown in FIG. 1 initiates the FEA simulation logic 25 for the particular system or process whose performance is being evaluated. For example, block B102 may entail commencing an FEA-based stress analysis of the example system 10 shown in FIG. 1. The method 100 then proceeds to block B104.

At block B104, the FEA simulation ("FEA/SIM") is conducted for the modeled system or process, with block B104 using a baseline time interval, Δt, for an initial iteration ($t_1$). For example, $t_1=\Delta t=0.01$ s to 0.1 s in a non-limiting example range of baseline time intervals. The method 100 then proceeds to block B106.

Block B106 includes calculating the criteria ratio ($r_x$) of a predetermined set of scaling criteria for later use in determining an appropriate time-scaling factor (f), where the time-scaling factor (f) is generally determined as an inverse function of the criteria ratio ($r_x$), e.g., $$f \propto \frac{k}{r_x^n}$$

where k and n are application-specific/calibrated constants. The criteria ratio ($r_x$) may be inversely related to the time-scaling factor (f) as shown above, e.g., inversely proportional in some embodiments. In the notation used for the criteria ratio ($r_x$), the identify of subscript "x" is selected based on the particular configuration of the system or process whose performance is being simulated.

As a non-limiting example, general criteria may include a ratio of kinetic energy to another energy term, such as strain energy, thermal energy, kinetic energy, or a partial/total summation of one or more of such energy terms in either an incremental form or a whole form. For instance:

$$r_{\Delta E} = \frac{\Delta E_{kinetic}}{\Delta E_{total}} \text{ or } r_E = \frac{E_{kinetic}}{E_{total}}$$

In these equations, the total summation is used in the denominators without limiting applications to such a term, with the "Δ" symbol representing the incremental form of the equations and the absence of the "Δ" symbol representing the whole/non-incremental form.

In another embodiment, block B106 may include calculating a ratio of a residual force $r_F$. Analogous to static analysis, such a ratio may be calculated as norm of residual forces (F) in the system or process whose performance is being simulated and analyzed, to the norm of maximum internal forces ($F_{max}$) or total forces ($F_{total}$) at each increment or specific time interval:

$$r_{\Delta F} = \frac{\|\Delta F\|}{\|\Delta F_{max}\|},$$

$$r_F = \frac{\|F\|}{\|F_{max}\|}$$

$$r_{\Delta F} = \frac{\|\Delta F\|}{\|\Delta F_{total}\|},$$

$$r_F = \frac{\|F\|}{\|F_{total}\|}$$

One could also use maximum residual force at a given node versus maximum reaction force at that or another given node, etc., and therefore the above formulas are exemplary and non-limiting.

In still another embodiment, a ratio of displacement ($r_u$) or incremental displacement ($r_{\Delta u}$) may be calculated as the norm of the displacement (u) or incremental displacement (Δu) to norm of the maximum ($u_{max}$) or incremental maximum displacement ($\Delta u_{max}$) as the above-noted scaling criteria:

$$r_{\Delta u} = \frac{\|\Delta u\|}{\|\Delta u_{max}\|} \text{ or } r_u = \frac{\|u\|}{\|u_{max}\|}$$

with the right-hand equation once again representing the whole/non-incremental form and the left-hand equation representing the incremental form of the above equations. Such example ratios or other application-suitable ratios may be used to implement block B106. Other terms may be used in other implementations of the present method 100, including but not limited to temperature, velocity, acceleration, stress, strain, strain rate, etc.

In still other embodiments, the various criteria ratios ($r_x$) may be individual calculated, and then a maximum of the above-noted ratios ($r_x$) may be used to calculate the time-scaling factor. Or, the method 100 may include calculating a weighted sum of the various criteria ratios, i.e., $\Sigma W_i r_i$, where $W_i$ a weight applied to each of the (i) criteria ratios. Equal weighting may be used, or each of the criteria ratios may be differently weighted depending on the application. The method 100 proceeds to block B108 once the criteria ratio ($r_x$) has been determined by the computer network 150.

As mentioned above, a sub-model may be extracted from a full finite element model in block B106 to determine the criteria ratio ($r_x$). The sub-model should be chosen to include neighboring elements, e.g., 10-20 mm away from an applied heat source in the non-limiting example laser welding application. Choosing the criteria ratio ($r_x$) in this manner, and then using the calculated criteria ratio for executing the remaining blocks of method 100 with the full finite element model, may enhance computational efficiency by an order of magnitude or more, and may also improve overall simulation accuracy. The latter beneficial effect is due to the higher sensitivity of the criteria ratio ($r_x$) to changes in thermal and mechanical responses proximate the heat source.

Block B108 of FIG. 2 includes determining the time-scaling factor using the criteria ratio ($r_x$) from block B106, with block B108 likewise conducted via the FEA computing network 150. As noted above, the time-scaling factor (f) and the criteria ratio ($r_x$) are inversely proportional to each other. The time-scaling factor (f) may be updated such that the criteria ratio ($r_x$) is controlled below a low threshold value, e.g., about 10 to 15 percent in one embodiment, or below about 5 percent in another.

As part of block B108, the criteria ratio ($r_x$) may be compared to a calibrated threshold ratio, with the time-scaling factor (f) possibly adjusted upward if the criteria ratio ($r_x$) is less than the threshold ratio and adjusted downward if the criteria ratio ($r_x$) is greater than the threshold ratio. The amount of such an adjustment may be determined in proportion to the amount by which the criteria ratio ($r_x$) exceeds or is exceed by the threshold ratio. The baseline time interval noted above is then adapted using the time-scaling factor (f) to generate a scaled time factor as noted below in block B110. The method 100 then proceeds to block B110.

At block B110, the computer network 150 of FIG. 1 determines the output values/system response, e.g., the thermal states of the example system 10 of FIG. 1, at the scaled time factor, i.e., t=t+f Δt, and then proceeds to block B112.

Block B112 includes determining whether the FEA analysis is complete ("EOA"), e.g., by comparing the simulated time to a calibrated end time. For instance, if a welding process requires simulation of 12-15 s of welding time, such that the calibrated end time is $t_{end}$=12-15 s, the FEA analysis would be complete after the indicated 12-15 s of welding time has been simulated. The method 100 returns to block B104 when the FEA analysis is not yet complete, with the next subsequent iteration of the method 100 using the updated time-scaling factor t=t+f Δt. Block B114 is executed in the alternative when the FEA analysis is complete.

The method 100 is complete ("**") at block B114. Upon completion of the above-described FEA analysis, as will be appreciated by those of ordinary skill in the art, a successful simulation result may trigger various actions, such as but not limited to construction of a working prototype of the evaluated system or process for further testing and evaluation. An unsuccessful simulation result, i.e., a simulated response that differs from an expected response, may prompt adjustment or modification of inputs to the underlying mathematical models used in the FEA simulation logic 25, or the models themselves.

In terms of relative performance, and in keeping with the exemplary laser embodiment of the system 10 shown in FIG. 1, a commercially-available implicit finite element model may require over 43,000 seconds of processing time (about 12 hours) to process 126,000 finite elements. An example arc-welding case may have fewer finite elements, for instance 95,000 finite elements, with a slightly lower processing time of about 39,000 seconds (about 10.8 hours). Applying the above-described adaptive scaling method 100 to an explicit FEA analysis and simulation of the two example cases may reduce processing time to about 859 seconds (0.24 hours) and 577 seconds (0.16 hours), respectively. Thus, the method 100 may be expected to yield orders of magnitude increases in the available computational speed of the computer network 150 while still maintaining sufficient accuracy relative to existing off-the-shelf FEA software in implementing the FEA simulation logic 25.

Numerical values of parameters of quantities or conditions used in the present specification, including the appended claims, are to be understood as being modifiable by the term "about", whether or not "about" actually appears before the numerical value. The term "about" as used herein indicates that the stated numerical value allows for slight imprecision with respect to exactness in the stated value or range, i.e., reasonably close or nearly. If the imprecision provided by the term "about" is not otherwise understood in the art with this ordinary meaning, then "about" as used herein indicates at least variations that may arise from ordinary methods of measuring and using such parameters, for instance ±5 percent of the stated value or range. In addition, disclosure of a range includes disclosure of values and further divided ranges within such a range.

The detailed description and the drawings or figures are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims.

What is claimed is:

1. A method for accelerating an explicit finite element analysis (FEA) simulation, the method comprising:
   performing an initial iteration of the explicit FEA simulation for a laser welding process or a laser welding system according to a baseline time interval Δt via an FEA computing network;
   calculating a criteria ratio ($r_x$) of a predetermined set of scaling criteria for the modeled system or process via the FEA computing network;
   determining a time-scaling factor (f) using the criteria ratio via the FEA computing network as an inverse function of the criteria ratio, wherein f>>1;
   applying the time-scaling factor to the baseline time interval in real-time to thereby generate a respective scaled time interval fΔt for subsequent iterations of the explicit FEA simulation, wherein the respective scaled time interval fΔt accelerates the explicit FEA simulation by reducing a required amount of FEA processing time; and
   performing the subsequent iterations of the explicit FEA simulation at the respective scaled time intervals fΔt using the FEA computing network until reaching a calibrated end time of the explicit FEA simulation;
   wherein $$f \propto \frac{k}{r_x^n}$$

in which k and n are application-consistent/calibrated constants.

2. The method of claim 1, wherein calculating the criteria ratio is conducted for a sub-model of a total model of the modeled system or process.

3. The method of claim 1, wherein the criteria ratio is determined as a function of an energy ratio, a displacement ratio, and/or a force ratio.

4. The method of claim 3, wherein the criteria ratio is the energy ratio, and the energy ratio is a ratio of incremental kinetic energy to incremental total energy term in the modeled system or process.

5. The method of claim 3, wherein the criteria ratio is the force ratio.

6. The method of claim 5, wherein the force ratio is a ratio of a norm of incremental forces to a norm of incremental maximum forces.

7. The method of claim 1, the method further comprising:
comparing the criteria ratio to a threshold ratio; and
adjusting the time-scaling factor upward or downward by a predetermined amount when the criteria ratio is less than or greater than the threshold ratio, respectively.

8. The method of claim 7, wherein adjusting the time-scaling factor occurs in proportion to an amount by which the criteria ratio exceeds or is exceeded by the threshold ratio.

9. A tangible, non-transitory computer-readable medium for use during an explicit finite element analysis (FEA) simulation for a laser welding process or a laser welding system, wherein the computer-readable medium includes instructions executable by a core or processor of an FEA computing network to cause the FEA computing network, subsequent to an initial iteration of the FEA computing logic using a baseline time interval, to:
calculate a criteria ratio ($r_x$) of a predetermined set of scaling criteria via the FEA computing network;
determine a time-scaling factor (f) using the criteria ratio, via the FEA computing network, wherein the time-scaling factor is an inverse function of the criteria ratio and f$\gg$1;
apply the time-scaling factor to the baseline time interval in real-time to thereby generate a respective scaled time interval f$\Delta$t, wherein the respective scaled time interval accelerates the explicit FEA simulation for the laser welding process or the laser welding system by reducing a required amount of FEA processing time; and
perform the subsequent iterations of the explicit FEA simulation at the respective scaled time intervals f$\Delta$t using the FEA computing network until reaching a calibrated end time of the explicit FEA simulation;
wherein $$f \propto \frac{k}{r_x^n},$$

in which k and n are application-specific/calibrated constants.

10. The computer-readable medium of claim 9, wherein execution of the instructions causes the FEA computing network to calculate the criteria ratio only for a sub-model of a total model.

11. The computer-readable medium of claim 9, wherein the criteria ratio is an energy ratio, a displacement ratio, and/or a force ratio.

12. The computer-readable medium of claim 11, wherein the criteria ratio is the energy ratio, and the energy ratio is a ratio of incremental kinetic energy to incremental total energy term.

13. The computer-readable medium of claim 11, wherein the criteria ratio is the force ratio.

14. The computer-readable medium of claim 13, wherein the force ratio is a ratio of a norm of incremental forces to a norm of incremental maximum forces.

15. The computer-readable medium of claim 11, wherein the criteria ratio includes the displacement ratio, and the displacement ratio is a ratio of an incremental displacement to a norm of an incremental maximum displacement.

16. The computer-readable medium of claim 9, wherein execution of the instructions further causes the FEA computing network to:
compare the criteria ratio to a threshold ratio; and
adjust the time-scaling factor upward or downward by a predetermined amount when the criteria ratio is less than or greater than the threshold ratio, respectively.

17. The computer-readable medium of claim 16, wherein execution of the instructions causes the FEA computing network to adjust the time-scaling factor upward or downward by the predetermined amount in proportion to an amount by which the criteria ratio exceeds or is exceeded by the threshold ratio.

18. The method of claim 1, wherein the calibrated end time of the FEA simulation is 12-15 seconds of welding time in the laser welding system or the laser welding process.

19. The computer-readable medium of claim 11, wherein the calibrated end time of the FEA simulation is 12-15 seconds of welding time in the laser welding system or the laser welding process.

* * * * *